(12) United States Patent
Liao et al.

(10) Patent No.: US 11,843,074 B2
(45) Date of Patent: Dec. 12, 2023

(54) SELECTABLE-REPAIRING MICRO LIGHT EMITTING DIODE DISPLAY AND REPAIRING METHOD THEREOF

(71) Applicant: PlayNitride Display Co., Ltd., Miaoli County (TW)

(72) Inventors: Kuan-Yung Liao, Miaoli County (TW); Sheng-Yuan Sun, Miaoli County (TW); Kun-Hua Tsai, Miaoli County (TW)

(73) Assignee: PlayNitride Display Co., Ltd., Miaoli County (TW)

( * ) Notice: Subject to any disclaimer, the term of this patent is extended or adjusted under 35 U.S.C. 154(b) by 268 days.

(21) Appl. No.: 17/243,531

(22) Filed: Apr. 28, 2021

(65) Prior Publication Data

US 2022/0246792 A1  Aug. 4, 2022

(30) Foreign Application Priority Data

Jan. 29, 2021 (TW) ................................ 110103550

(51) Int. Cl.
| | |
|---|---|
| *H01L 33/00* | (2010.01) |
| *H01L 21/66* | (2006.01) |
| *H01L 27/12* | (2006.01) |
| *H01L 33/62* | (2010.01) |
| *H01L 25/075* | (2006.01) |

(52) U.S. Cl.
CPC .......... *H01L 33/0095* (2013.01); *H01L 22/22* (2013.01); *H01L 25/0753* (2013.01); *H01L 27/1214* (2013.01); *H01L 33/62* (2013.01); *H01L 2933/0066* (2013.01)

(58) Field of Classification Search
CPC . H01L 33/0095; H01L 22/22; H01L 25/0753; H01L 27/1214; H01L 33/62; H01L 2933/0066; H01L 27/1251
See application file for complete search history.

(56) References Cited

U.S. PATENT DOCUMENTS

| | | | |
|---|---|---|---|
| 2016/0018094 A1 | 1/2016 | Bower et al. | |
| 2018/0374828 A1* | 12/2018 | Liao | ...................... H01L 25/167 |
| 2020/0235128 A1* | 7/2020 | Shin | .................. H01L 21/76894 |
| 2021/0043616 A1* | 2/2021 | Jung | ....................... H01L 24/83 |

FOREIGN PATENT DOCUMENTS

| | | |
|---|---|---|
| TW | 201926669 A | 7/2019 |
| TW | 202026732 A | 7/2020 |
| TW | I715514 B | 1/2021 |

* cited by examiner

*Primary Examiner* — Ratisha Mehta
(74) *Attorney, Agent, or Firm* — CKC & Partners Co., LLC

(57) ABSTRACT

A selectable-repairing micro light emitting diode display is provided. A backplane includes a plurality of transistor units. A plurality of pixel units are disposed on the backplane, and each of the pixel units includes a plurality of original sub-pixel units and at least one selectable-repairing sub-pixel unit. Each of the original sub-pixel units includes a set of original pad. The set of original pad is disposed on the backplane and connected to one of the transistor units. The at least one selectable-repairing sub-pixel unit is arranged between two of the original sub-pixel units next to each other and having different colors, and includes a set of repairing pad. The set of repairing pad is not connected to the transistor units. A plurality of micro light emitting elements are electrically connected to the sets of original pad and controlled to emit light through the corresponding transistor units, respectively.

10 Claims, 10 Drawing Sheets

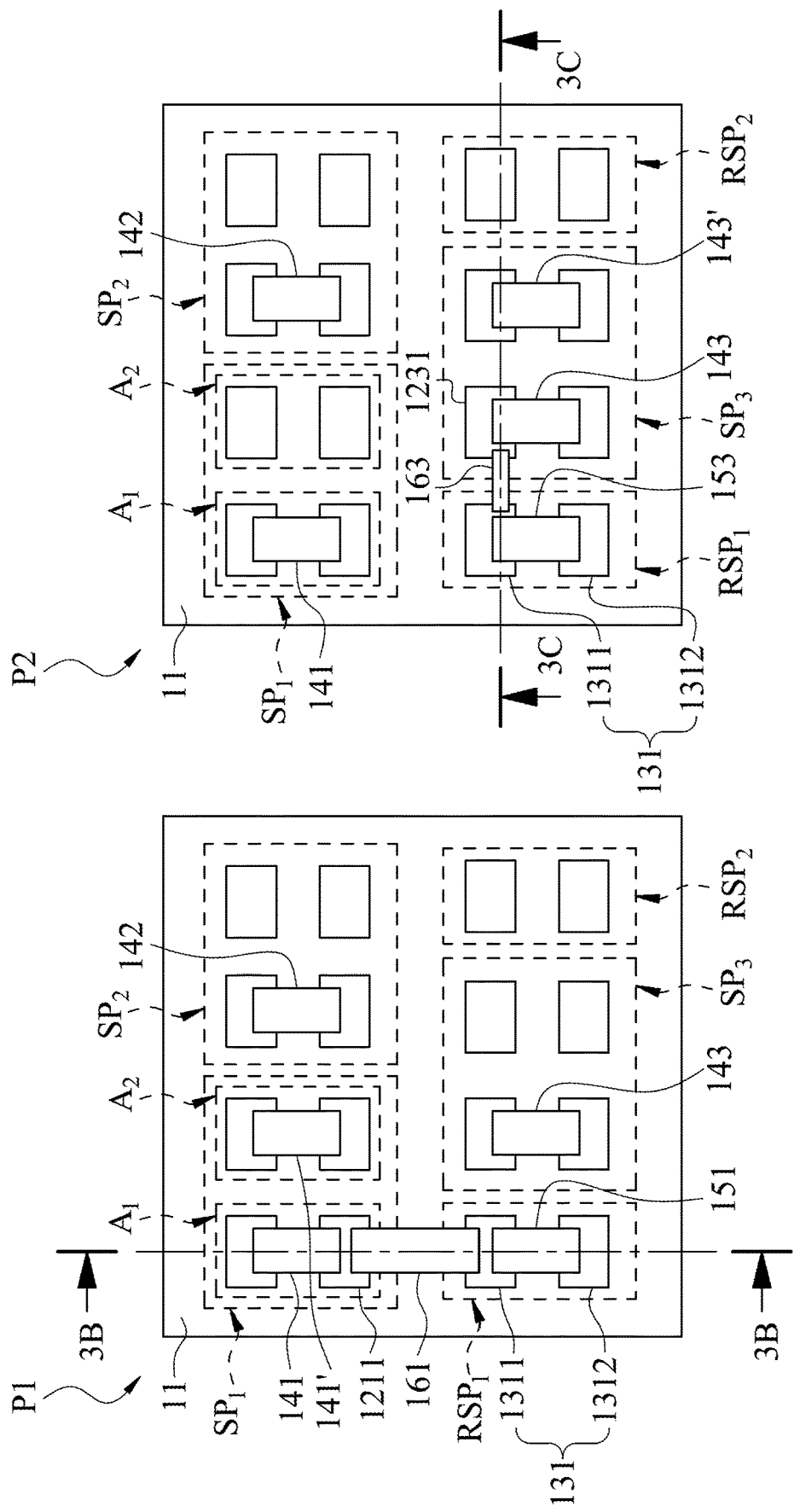

SELECTABLE-REPAIRING MICRO LIGHT EMITTING DIODE DISPLAY AND REPAIRING METHOD THEREOF

RELATED APPLICATIONS

This application claims priority to Taiwan Application Serial Number 110103550, filed Jan. 29, 2021, which is herein incorporated by reference.

BACKGROUND

Technical Field

The present disclosure relates to a display and a repairing method thereof. More particularly, the present disclosure relates to a selectable-repairing micro light emitting diode display and a repairing method thereof.

Description of Related Art

A Micro Light Emitting Diode (Micro LED) display is a type of Flat-Panel Display (FPD), which is composed of LEDs with the size level of 1 to 100 micron. Compared with the conventional Liquid-Crystal Display (LCD), Micro LED display has a higher contrast ratio and a faster response time, and consumes less power. With the technological advancement of the optoelectronic industry, the volume of optoelectronic components is gradually becoming smaller. Therefore, Micro LED displays have become a mainstream trend in the current display industry. The current Micro LED displays are mainly arrayed Micro LEDs.

In general, the process yield of Micro LED displays has not perfect yet. After Micro LEDs are disposed on and connected to a backplane, few defective pixels are still found. The conventional method for solving the defective pixels is to provide a compensation area beside an electrode pad of the defective Micro LED. The compensation area can only make subsequent repairs to the specific light color alone so as to remove the Micro LED in the defective pixel. However, the conventional repairing-method takes a longer time, and the arrayed Micro LEDs cannot make perfect use of the space of the backplane and may even cause uneven light color after repair.

In view of the abovementioned problems, the current market lacks a Micro LED display with electrode pads that can freely select to repair defective pixels and a repairing method thereof, which are highly anticipated by the public and becomes the goal and the direction of relevant industry efforts.

SUMMARY

According to one aspect of the present disclosure, a selectable-repairing micro light emitting diode display is provided and includes a backplane, a plurality of pixel units and a plurality of micro light emitting elements. The backplane includes a plurality of transistor units. The pixel units are disposed on the backplane. Each of the pixel units includes a plurality of original sub-pixel units and at least one selectable-repairing sub-pixel unit. The original sub-pixel units have different colors, and each of the original sub-pixel units includes a set of original pad. The set of original pad is disposed on the backplane and correspondingly connected to one of the transistor units. The at least one selectable-repairing sub-pixel unit is arranged between two of the original sub-pixel units next to each other and having different colors and includes a set of repairing pad. The set of repairing pad is not connected to the transistor units. The micro light emitting elements are electrically connected to the sets of original pad of the original sub-pixel units and controlled to emit light through the corresponding transistor units, respectively.

According to another aspect of the present disclosure, a repairing method of a selectable-repairing micro light emitting diode display is provided and includes performing an element transferring step, a detection compensating step, a redetecting step, a repair selecting step and a circuit repairing step. The element transferring step is performed to provide a backplane. A plurality of pixel units are disposed on the backplane. Each of the pixel units includes a plurality of original sub-pixel units and at least one selectable-repairing sub-pixel unit, and the original sub-pixel units have different colors. Then, the element transferring step is performed to mass transfer a plurality of micro light emitting elements to a plurality of light emitting areas of the original sub-pixel units. The detection compensating step is performed to detect the micro light emitting elements in the light emitting areas and bond a plurality of predestinated micro light emitting elements to a plurality of compensation areas of the original sub-pixel units which are detected to be failed. The redetecting step is performed to detect the predestinated micro light emitting elements in the compensation areas to obtain a detecting result. The repair selecting step is performed to dispose a repairing micro light emitting element on a set of repairing pad of the at least one selectable-repairing sub-pixel unit according to the detecting result. The circuit repairing step is performed according to the detecting result to selectively form a repairing circuit between a set of original pad of one of the original sub-pixel units and the set of repairing pad of the at least one selectable-repairing sub-pixel unit, and to electrically connect the set of original pad and the set of repairing pad.

BRIEF DESCRIPTION OF THE DRAWINGS

The present disclosure can be more fully understood by reading the following detailed description of the embodiment, with reference made to the accompanying drawings as follows:

FIG. 3A shows a schematic view of two pixel units next to each other after a selectable repair of FIG. 1.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Figure 1:
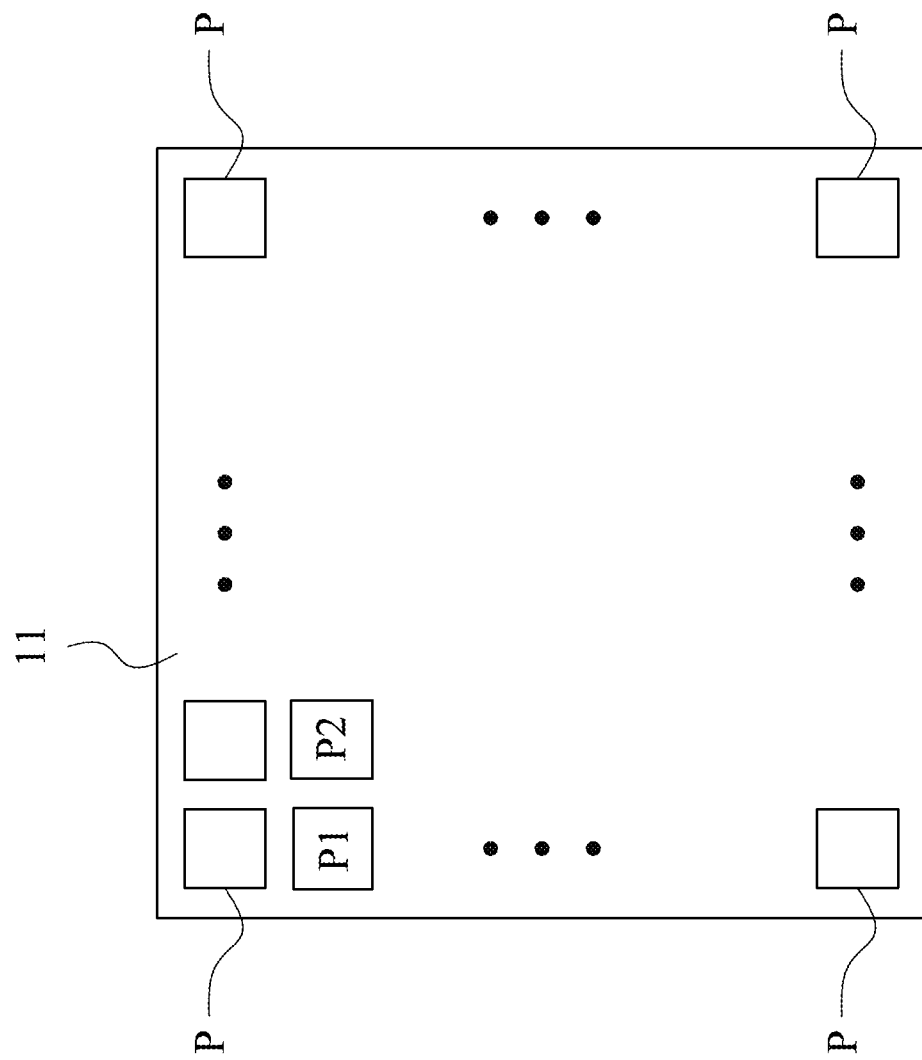
FIG. 1 shows a schematic view of a selectable-repairing micro light emitting diode display according to a first embodiment of the present disclosure.
Figure 2:
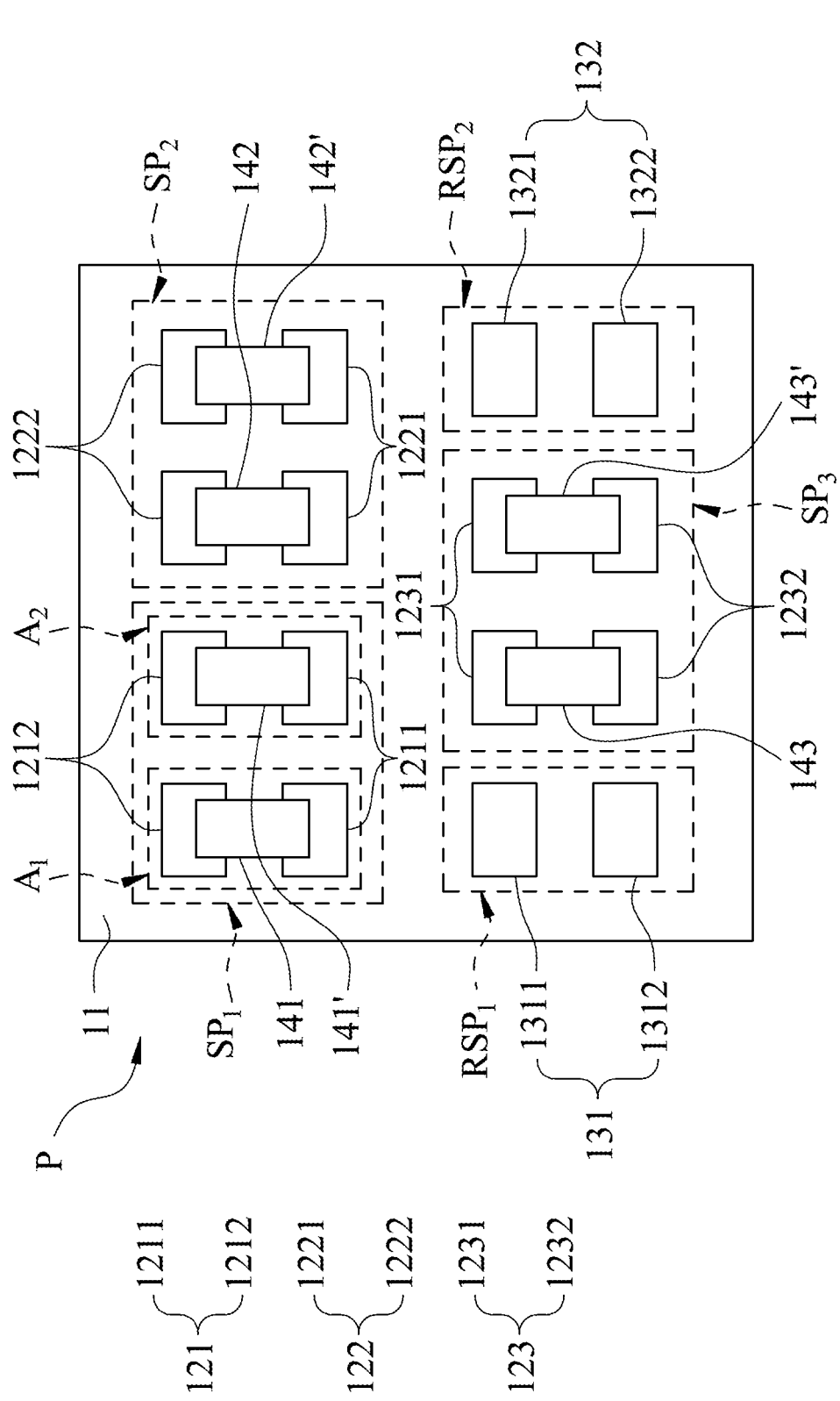
FIG. 2 shows a schematic view of a pixel unit of FIG. 1.

Please refer to FIGS. 1 and 2. FIG. 1 shows a schematic view of a selectable-repairing micro light emitting diode display 100 according to a first embodiment of the present disclosure. FIG. 2 shows a schematic view of a pixel unit P of FIG. 1. In FIGS. 1 and 2, the selectable-repairing micro light emitting diode display 100 includes a backplane 11, a plurality of pixel units P and a plurality of micro light emitting elements 141, 142, 143. The backplane 11 includes a plurality of transistor units 17 (one of the transistor units 17 shown in FIG. 3B). The pixel units P are disposed on the backplane 11 and driven to emit light by the transistor units 17 of the backplane 11 to present an image. Each of the pixel units P includes a plurality of original sub-pixel units $SP_1$, $SP_2$, $SP_3$ and two selectable-repairing sub-pixel units $RSP_1$, $RSP_2$. The original sub-pixel units $SP_1$, $SP_2$, $SP_3$ have different colors and include a plurality of sets of original pad 121, 122, 123, respectively. Each of the sets of original pad 121, 122, 123 is disposed on the backplane 11 and correspondingly connected to one of the transistor units 17. The selectable-repairing sub-pixel unit $RSP_1$ is arranged between the original sub-pixel units $SP_1$, $SP_3$ next to each other and having different colors and includes a set of repairing pad 131. The selectable-repairing sub-pixel unit $RSP_2$ is arranged between the original sub-pixel units $SP_2$, $SP_3$ next to each other and having different colors and includes a set of repairing pad 132. It is worth noting that the sets of repairing pad 131, 132 are not directly connected to any of the transistor units 17. In addition, the micro light emitting elements 141, 142, 143 are electrically connected to the sets of original pad 121, 122, 123 of the original sub-pixel units $SP_1$, $SP_2$, $SP_3$ and controlled to emit light through the corresponding transistor units 17, respectively.

Therefore, the selectable-repairing micro light emitting diode display 100 of the present disclosure can freely select the original sub-pixel unit $SP_1$, the original sub-pixel units $SP_2$ or the original sub-pixel units $SP_3$ to be repaired according to a detecting result of a post-processing through the arrangement of the selectable-repairing sub-pixel units $RSP_1$, $RSP_2$ without limiting the repairing light colors, so that the space utilization of the pixel units P is increased, and the overall yield is improved.

In particular, the original sub-pixel unit $SP_1$ is a first-color original sub-pixel unit. The original sub-pixel unit $SP_2$ is a second-color original sub-pixel unit. The original sub-pixel unit $SP_3$ is a third-color original sub-pixel unit. The selectable-repairing sub-pixel unit $RSP_1$ is arranged between the first-color original sub-pixel unit and the third-color original sub-pixel unit. The selectable-repairing sub-pixel unit $RSP_2$ is arranged between the second-color original sub-pixel unit and the third-color original sub-pixel unit. In the first embodiment, the original sub-pixel unit $SP_1$ can be blue, the original sub-pixel unit $SP_2$ can be green, and the original sub-pixel unit $SP_3$ can be red. In other embodiments, each of the original sub-pixel units $SP_1$, $SP_2$, $SP_3$ can have other color arranging sequences, but the present disclosure is not limited thereto.

In each of the pixel units P, the set of original pad 121 can include two pixel-electrode pads 1211. The set of original pad 122 can include two pixel-electrode pads 1221. The set of original pad 123 can include two pixel-electrode pads 1231. The pixel-electrode pads 1211 of the set of original pad 121 are electrically connected to one of the transistor units 17. The pixel-electrode pads 1221 of the set of original pad 122 are electrically connected to other one of the transistor units 17. The pixel-electrode pads 1231 of the set of original pad 123 are electrically connected to another one of the transistor units 17. Moreover, the set of repairing pad 131 can include a pixel-electrode pad 1311. The set of repairing pad 132 can include a pixel-electrode pad 1321, and the pixel-electrode pad 1311 and the pixel-electrode pad 1321 are not electrically connected to other electrode pads on the backplane 11.

Further, the set of original pad 121 can further include two common-electrode pads 1212. The set of original pad 122 can further include two common-electrode pads 1222. The set of original pad 123 can further include two common-electrode pads 1232. The set of repairing pad 131 can further include a common-electrode pad 1312. The set of repairing pad 132 can further include a common-electrode pad 1322. In particular, the common-electrode pads 1212, 1222, 1232, 1312, 1322 are electrically connected to each other.

In the first embodiment, the original sub-pixel units $SP_1$ can include a light emitting area $A_1$ and a compensation area $A_2$. The light emitting area $A_1$ has one of the pixel-electrode pads 1211 and one of the common-electrode pads 1212, and is configured to dispose the micro light emitting element 141. The compensation area $A_2$ has another of the pixel-electrode pads 1211 and another of the common-electrode pads 1212. The compensation area $A_2$ is arranged adjacent to the light emitting area $A_1$, and the one of the pixel-electrode pads 1211 of the light emitting area $A_1$ and the another of the pixel-electrode pads 1211 of the compensation area $A_2$ are electrically connected to the transistor unit 17. Similarly, the original sub-pixel unit $SP_2$ and the original sub-pixel unit $SP_3$ will not be detailedly described.

After the selectable-repairing micro light emitting diode display 100 of the present disclosure is manufactured, the original sub-pixel units $SP_1$, $SP_2$, $SP_3$ of each of the pixel units P need to be detected to check whether there are defective Micro Light Emitting Diodes (Micro LEDs), that is, detecting whether the micro light emitting elements 141, 142, 143 emit light normally. Since the pixel-electrode pad 1211 of the light emitting area $A_1$ and the pixel-electrode pad 1211 of the compensation area $A_2$ in the original sub-pixel units $SP_1$, $SP_2$, $SP_3$ are electrically connected to the same transistor unit 17, in response to determining that the original sub-pixel unit $SP_1$ is a defective pixel, a predestinated micro light emitting element 141' bonded in the compensation area $A_2$ can be used to repair the original sub-pixel unit $SP_1$; similarly, the predestinated micro light emitting elements 142', 143' will not be detailedly described.

Please refer to FIGS. 1 and 3A. FIG. 3A shows a schematic view of two pixel units P1, P2 next to each other after a selectable repair of FIG. 1. In FIGS. 1 and 3A, the selectable-repairing micro light emitting diode display 100 can further include a repairing micro light emitting elements 151 and a repairing circuit 161 located on the pixel unit P1, and can further include a repairing micro light emitting elements 153 and a repairing circuit 163 located on the pixel unit P2. The repairing micro light emitting elements 151, 153 of the pixel units P1, P2 are electrically bonded to the set of repairing pad 131 of the selectable-repairing sub-pixel unit $RSP_1$. Especially, the repairing circuit 161 of the pixel unit P1 is electrically connected to and disposed between the set of repairing pad 131 and the set of original pad 121 of the first-color original sub-pixel unit (i.e., the original sub-pixel unit $SP_1$). The repairing circuit 163 of the pixel unit P2 is electrically connected to and disposed between the set of repairing pad 131 and the set of original pad 123 of the third-color original sub-pixel unit (i.e., the original sub-pixel unit $SP_3$). In detail, the repairing micro light emitting elements 151, 153 of the pixel units P1, P2 are electrically bonded to the pixel-electrode pads 1311 and the common-electrode pads 1312 of the sets of repairing pad 131, respectively. On the one hand, the repairing circuit 161 of the pixel unit P1 is connected to the pixel-electrode pad 1211 of the original sub-pixel unit $SP_1$ and the pixel-electrode pad 1311 of the set of repairing pad 131; on the other hand, the repairing circuit 163 of the pixel unit P2 is connected to the pixel-electrode pad 1231 of the original sub-pixel unit $SP_3$ and the pixel-electrode pad 1311 of the set of repairing pad 131.

Figure 3B:
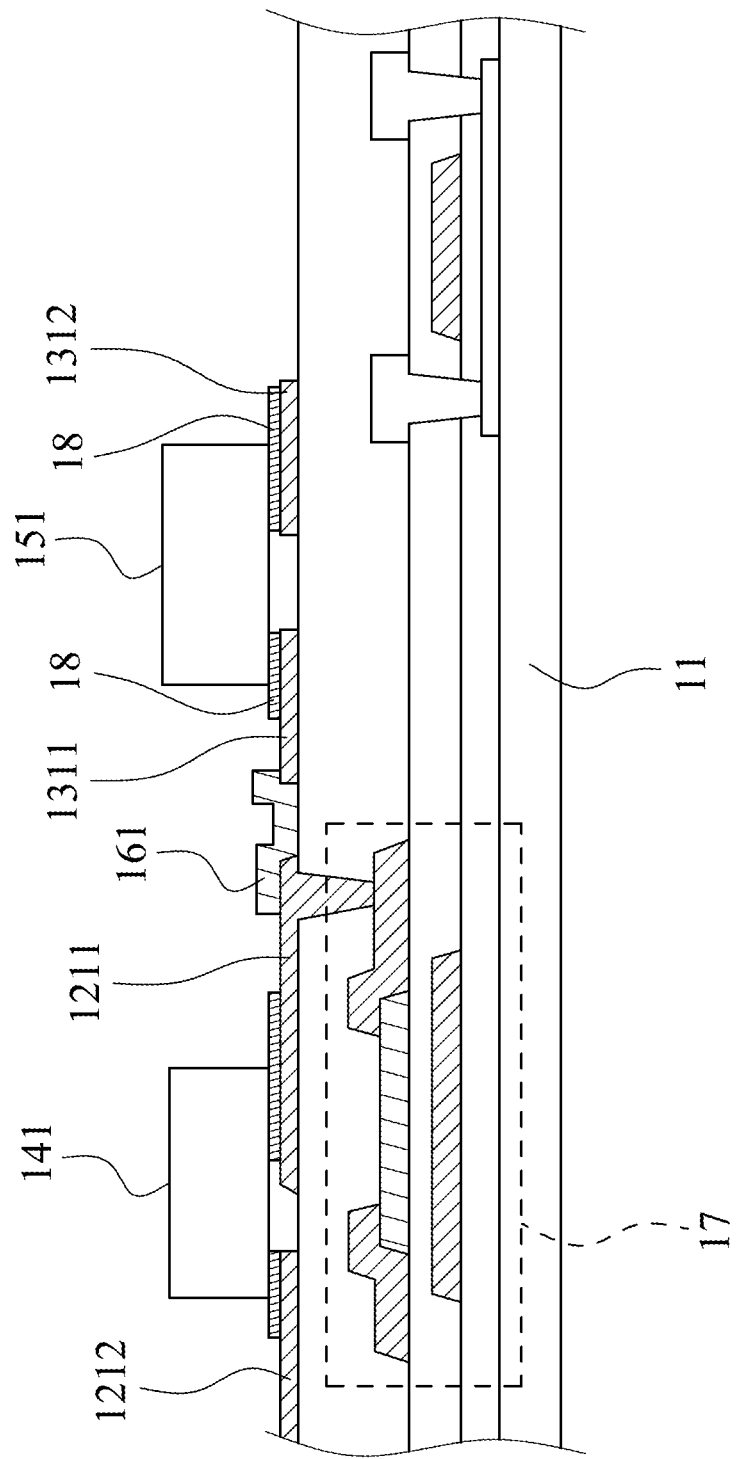
FIG. 3B shows a cross-sectional view of a section line 3B-3B of FIG. 3A.

Please refer to FIGS. 3A and 3B. FIG. 3B shows a cross-sectional view of a section line 3B-3B of FIG. 3A. In FIGS. 3A and 3B, the original sub-pixel units $SP_1$, $SP_2$, $SP_3$ of the pixel units P1, P2 are detected as defective sub-pixel, and a detecting result corresponding to the pixel units P1, P2 is generated. The detecting result shows that the micro light emitting element 141 and the predestinated micro light emitting element 141' in the original sub-pixel unit $SP_1$ of the pixel unit P1 are defective Micro LEDs, the repairing micro light emitting element 151 disposed on the set of repairing pad 131 is used to repair the original sub-pixel unit $SP_1$. In other words, the micro light emitting element 141 that is failed can be repaired not only through the predestinated micro light emitting element 141' in the compensation area $A_2$ but also through the repairing micro light emitting element 151 in the selectable-repairing sub-pixel unit $RSP_1$. In detail, the repairing circuit 161 is connected between the pixel-electrode pad 1211 of the set of original pad 121 and the pixel-electrode pad 1311 of the set of repairing pad 131 in the original sub-pixel unit $SP_1$ according to the detecting result (that is, the micro light emitting element 141 is the defective Micro LED).

In more detail, since the transistor unit 17 is electrically connected to the pixel-electrode pad 1211, the repairing micro light emitting element 151 is electrically connected to the transistor unit 17 inside the backplane 11 through the repairing circuit 161. The transistor unit 17 includes a plurality of circuit traces and a driving transistor. Further, the selectable-repairing micro light emitting diode display 100 can further include a plurality of bonding layers 18. One of the bonding layers 18 is disposed on the pixel-electrode pad 1311, and another of the bonding layers 18 is disposed on the common-electrode pad 1312. The repairing micro light emitting element 151 uses the bonding layers 18 to be bonded to the backplane 11 and to be electrically connected to a plurality of contacts of the transistor unit 17 so as to transmit current and drive the repairing micro light emitting element 151. However, the transistor unit 17 and the bonding layers 18 are manufacturing process technologies of the conventional panel display, and are not the technical focus of the present disclosure, so the details will not be detailedly described herein. In addition, in response to determining that the selectable-repairing sub-pixel unit $RSP_1$ and the original sub-pixel unit $SP_1$ are electrically connected to each other, it represents that the micro light emitting element 141 of the light emitting area $A_1$ and the predestinated micro light emitting element 141' of the compensation area $A_2$ cannot emit light by the transistor unit 17, or are missed in process. Therefore, the micro light emitting element 141 or the predestinated micro light emitting element 141' is removed from the light emitting area $A_1$ or the compensation area $A_2$, and only the repairing micro light emitting element 151 of the selectable-repairing sub-pixel unit $RSP_1$ can be driven to emit light by the transistor unit 17.

Figure 3C:
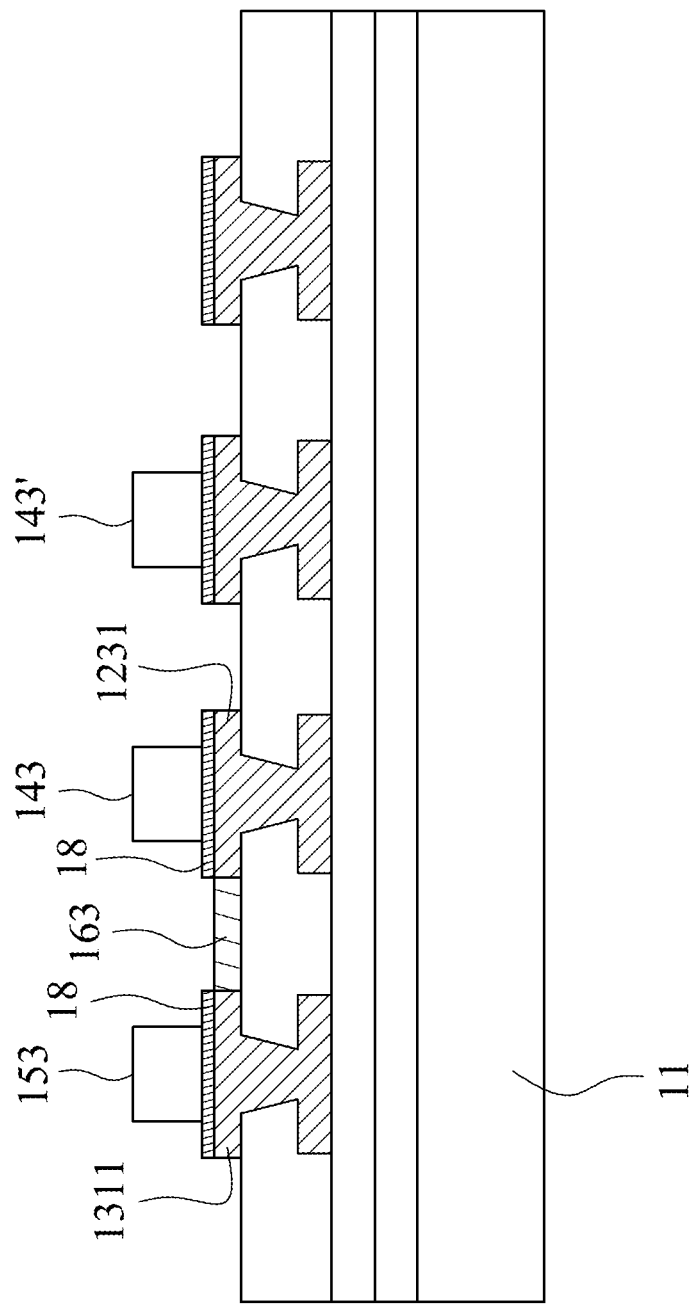
FIG. 3C shows a cross-sectional view of a section line 3C-3C of FIG. 3A.

Please refer to FIGS. 3A and 3C. FIG. 3C shows a cross-sectional view of a section line 3C-3C of FIG. 3A. In FIGS. 3A and 3C, if another detecting result shows that the original sub-pixel unit $SP_3$ of the pixel unit P2 is the defective Micro LED, the repairing micro light emitting element 153 is disposed on the set of repairing pad 131 of the selectable-repairing sub-pixel unit $RSP_1$ according to the another detecting result, and the repairing circuit 163 is connected between the pixel-electrode pad 1231 of the set of original pad 123 and the pixel-electrode pad 1311 of the set of repairing pad 131 in the original sub-pixel unit $SP_3$ according to the another of the detecting results at the same time. In addition, in response to determining that the selectable-repairing sub-pixel unit $RSP_1$ and the original sub-pixel unit $SP_3$ are electrically connected to each other, it represents that the micro light emitting element 143 of the light emitting area $A_1$ and the predestinated micro light emitting element 143' of the compensation area $A_2$ cannot emit light by the transistor unit 17, or are missed in process. Therefore, the micro light emitting element 143 or the predestinated micro light emitting element 143' is removed from the light emitting area $A_1$ or the compensation area $A_2$, and only the repairing micro light emitting element 153 of the selectable-repairing sub-pixel unit $RSP_1$ can be driven to emit light by the transistor unit 17. Therefore, the selectable-repairing sub-pixel units $RSP_1$, $RSP_2$ of the selectable-repairing micro light emitting diode display 100 of the present disclosure are not the same as the compensation area $A_2$. The selectable-repairing sub-pixel units $RSP_1$, $RSP_2$ are not limited by the light color so as to selectively repair the original sub-pixel unit $SP_1$, the original sub-pixel units $SP_2$ or the original sub-pixel units $SP_3$, so that the space utilization of the pixel units P1, P2 is increased, and the overall yield is improved, but the detecting results of the present disclosure is not limited thereto.

Figure 4:
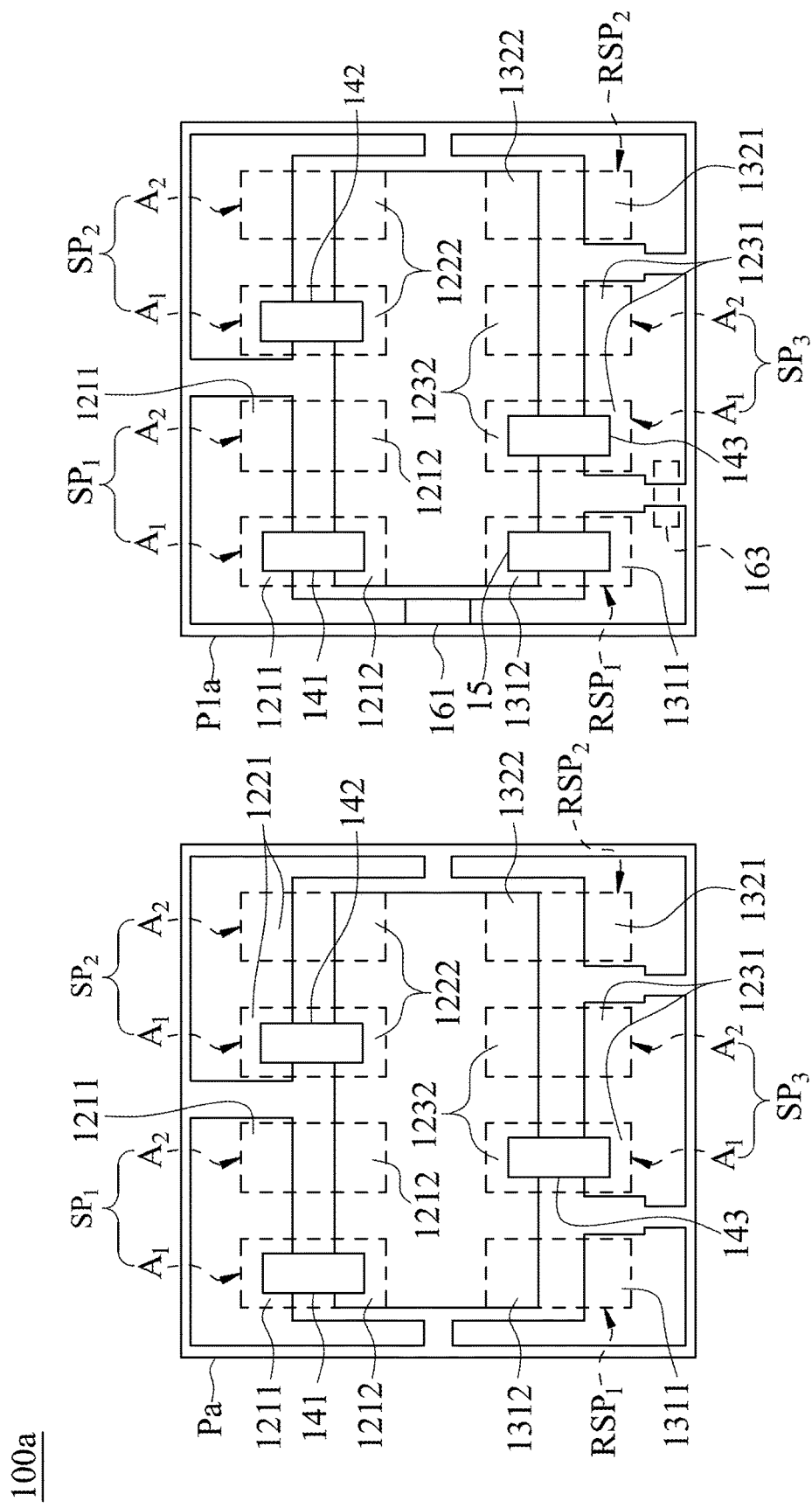
FIG. 4 shows a schematic view of two pixel units of a selectable-repairing micro light emitting diode display according to a second embodiment of the present disclosure.

FIG. 4 shows a schematic view of two pixel units Pa, P1a of a selectable-repairing micro light emitting diode display 100a according to a second embodiment of the present disclosure. In the second embodiment, the arrangement relationship of a plurality of original sub-pixel units $SP_1$, $SP_2$, $SP_3$ and two selectable-repairing sub-pixel units $RSP_1$, $RSP_2$ of the pixel units Pa, P1a are the same as the corresponding elements in the first embodiment, and will not be detailedly described herein. It is worth noting that the second embodiment is different from the first embodiment in that the common-electrode pad 1212 of the original sub-pixel unit $SP_1$, the common-electrode pad 1222 of the original sub-pixel unit $SP_2$, the common-electrode pad 1232 of the original sub-pixel unit $SP_3$, the common-electrode pad 1312 of the selectable-repairing sub-pixel unit $RSP_1$ and the common-electrode pad 1322 of the selectable-repairing sub-pixel unit $RSP_2$ are integrally formed. In addition, the pixel-electrode pad 1211 of the light emitting area $A_1$ and the pixel-electrode pad 1211 of the compensation area $A_2$ of the original sub-pixel unit $SP_1$ of the second embodiment are integrally formed; similarly, the original sub-pixel unit $SP_2$ and the original sub-pixel unit $SP_3$ will not be detailedly described. Therefore, the plurality of pixel-electrode pads 1211, 1221, 1231, 1311, 1321 of the pixel units Pa, P1a surround the aforementioned integrally formed common-electrode pads. On the other hand, each of the pixel units Pa, P1a has one common-electrode pad, three pixel-electrode pads disposed on three sub-pixel units $SP_1$, $SP_2$, $SP_3$, respectively and two pixel-electrode pads disposed on two selectable-repairing sub-pixel unit $RSP_1$, $RSP_2$, respectively.

In the second embodiment, the pixel unit Pa is a good pixel that has not failed and does not need an arrangement of a predestinated micro light emitting element and a repairing micro light emitting element. The original sub-pixel unit $SP_1$ of the pixel unit P1a is a defective pixel, and the pixel unit P1a includes a repairing micro light emitting element 15. The repairing micro light emitting element 15 is bonded to the pixel-electrode pad 1311 and the aforementioned common-electrode pad which is integrally formed. In addition, the pixel unit P1a further includes a repairing circuit 161, and the repairing circuit 161 is connected between the pixel-electrode pad 1211 and the pixel-electrode pad 1311, so that the repairing micro light emitting element 15 replaces the failed or dropped micro light emitting element of the original sub-pixel unit $SP_1$ to emit light. If the original sub-pixel unit $SP_3$ of the pixel unit P1a is a defective pixel, a repairing circuit 163 is connected between the pixel-electrode pad 1231 and the pixel-electrode pad 1311, so that the repairing micro light emitting element 15 replaces the failed or dropped micro light emitting element of the original sub-pixel unit $SP_3$ to emit light.

Figure 5:
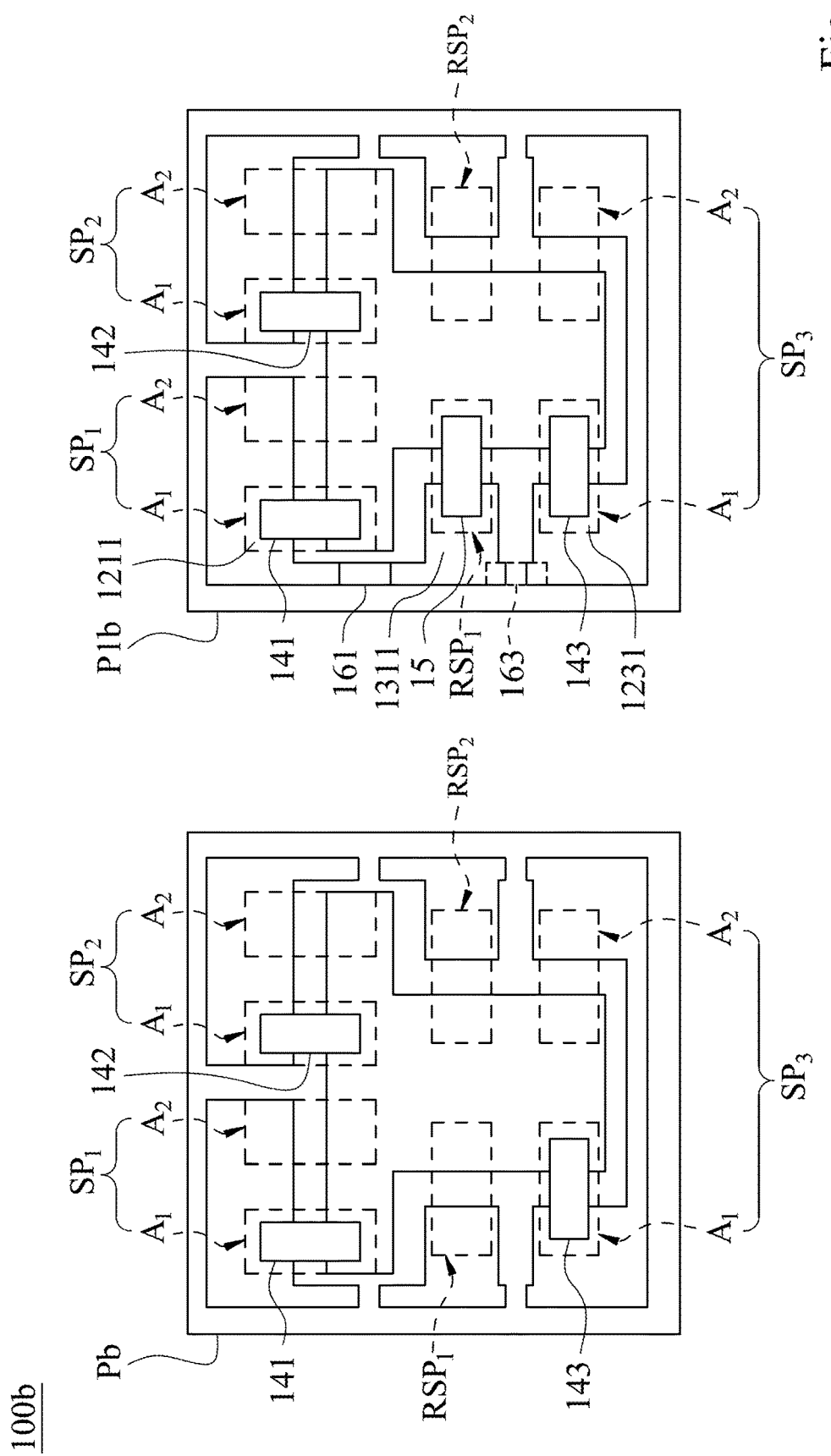
FIG. 5 shows a schematic view of two pixel units of a selectable-repairing micro light emitting diode display according to a third embodiment of the present disclosure.

FIG. 5 shows a schematic view of two pixel units Pb, P1b of a selectable-repairing micro light emitting diode display 100b according to a third embodiment of the present disclosure. In FIG. 5, a side of the selectable-repairing sub-pixel unit $RSP_1$ is arranged adjacent to the light emitting area $A_1$ and the compensation area $A_2$ of the original sub-pixel unit $SP_1$, and the other side of the selectable-repairing sub-pixel unit $RSP_1$ is arranged adjacent to the light emitting area $A_1$ of the original sub-pixel unit $SP_3$. In addition, a side of the selectable-repairing sub-pixel unit $RSP_2$ is arranged adjacent to the light emitting area $A_1$ and the compensation area $A_2$ of the original sub-pixel unit $SP_2$, and the other side of the selectable-repairing sub-pixel unit $RSP_2$ is arranged adjacent to the light emitting area $A_2$ of the original sub-pixel unit $SP_3$. In detail, each of the pixel units Pb, P1b includes a T-shape common-electrode pad and a plurality of pixel-electrode pads surrounding the T-shape common-electrode pad.

In the third embodiment, the pixel unit Pb is a good pixel that has not failed and does not need an arrangement of a predestinated micro light emitting element and a repairing micro light emitting element after a detection compensating step and a redetecting step. The original sub-pixel unit $SP_1$ of the pixel unit P1b is a defective pixel, and the pixel unit P1b includes a repairing micro light emitting element 15. The repairing micro light emitting element 15 is bonded to the pixel-electrode pad 1311 and the aforementioned common-electrode pad which is integrally formed. In addition, the pixel unit P1b further includes a repairing circuit 161, and the repairing circuit 161 is connected between the pixel-electrode pad 1211 and the pixel-electrode pad 1311, so that the repairing micro light emitting element 15 replaces the failed or dropped micro light emitting element of the original sub-pixel unit $SP_1$ to emit light. If the original sub-pixel unit $SP_3$ of the pixel unit P1b is a defective pixel, a repairing circuit 163 is connected between the pixel-electrode pad 1231 and the pixel-electrode pad 1311, so that the repairing micro light emitting element 15 replaces the failed or dropped micro light emitting element of the original sub-pixel unit $SP_3$ to emit light.

Figure 6:
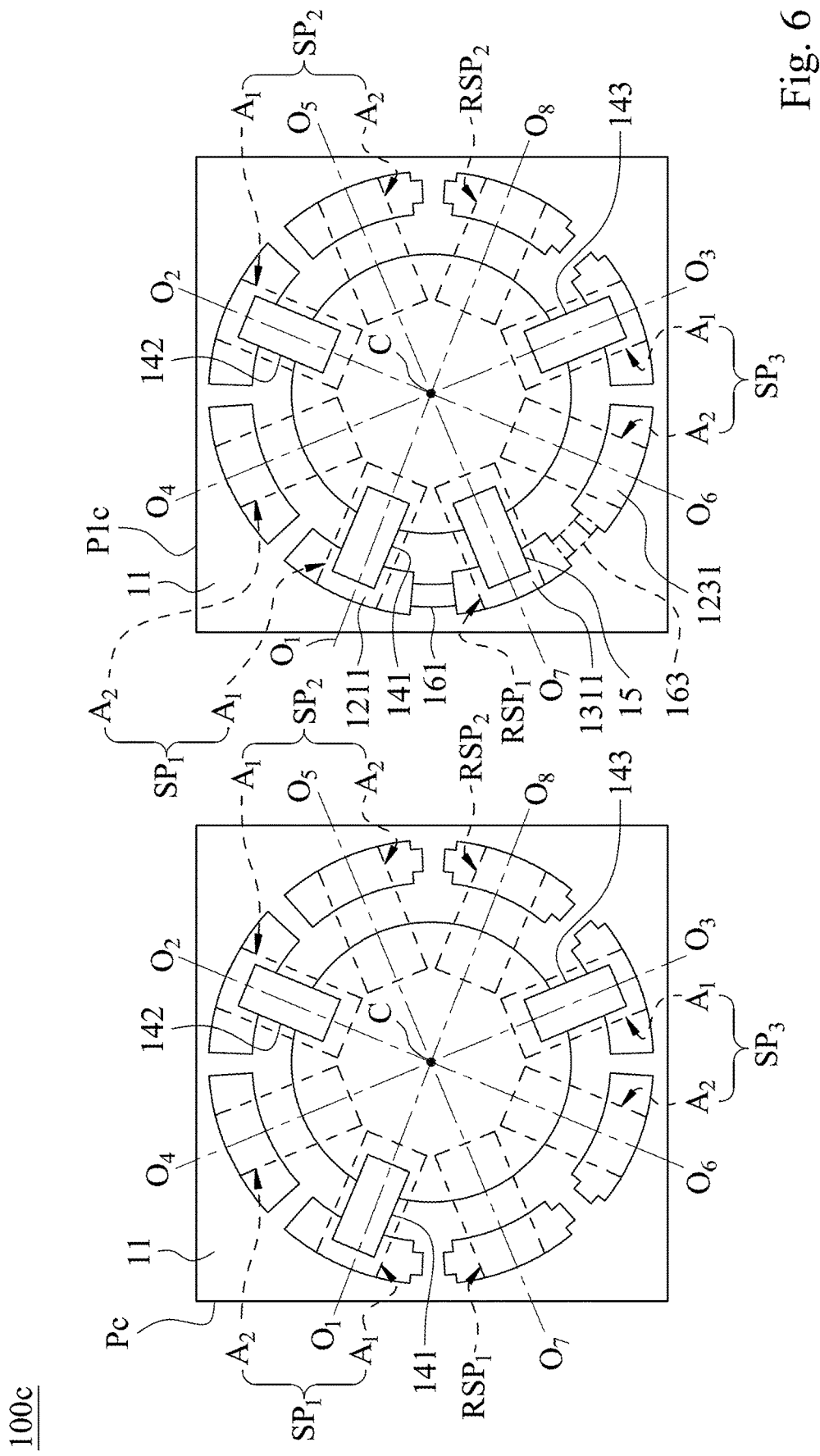
FIG. 6 shows a schematic view of two pixel units of a selectable-repairing micro light emitting diode display according to a fourth embodiment of the present disclosure.

FIG. 6 shows a schematic view of two pixel units Pc, P1c of a selectable-repairing micro light emitting diode display 100c according to a fourth embodiment of the present disclosure. In FIG. 6, the light emitting areas $A_1$ of the original sub-pixel units $SP_1$, $SP_2$, $SP_3$ of each of the pixel units Pc, P1c include a plurality of central axes $O_1$, $O_2$, $O_3$, respectively. The compensation areas $A_2$ of the original sub-pixel units $SP_1$, $SP_2$, $SP_3$ include a plurality of central axes $O_4$, $O_5$, $O_6$, respectively. The selectable-repairing sub-pixel units $RSP_1$, $RSP_2$ include a plurality of central axes $O_7$, $O_8$, respectively. The central axes $O_1$, $O_2$, $O_3$ of the light emitting areas $A_1$ of the original sub-pixel units $SP_1$, $SP_2$, $SP_3$, the central axes $O_4$, $O_5$, $O_6$ of the compensation areas $A_2$ of the original sub-pixel units $SP_1$, $SP_2$, $SP_3$ and the central axes $O_7$, $O_8$ of the selectable-repairing sub-pixel units $RSP_1$, $RSP_2$ intersect each other at a center C of the backplane 11. In detail, each of the pixel unit Pc, P1c includes an O-shape common-electrode pad and a plurality of pixel-electrode pads surrounding the O-shape common-electrode pad.

In the fourth embodiment, the pixel unit Pc is a good pixel that has not failed and does not need an arrangement of a predestinated micro light emitting element and a repairing micro light emitting element. The original sub-pixel unit $SP_1$ of the pixel unit P1c is a defective pixel, and the pixel unit P1c includes a repairing micro light emitting element 15. The repairing micro light emitting element 15 is bonded to the pixel-electrode pad 1311 of the set of repairing pad 131 and the aforementioned common-electrode pad which is integrally formed. In addition, the pixel unit P1c further includes a repairing circuit 161, and the repairing circuit 161 is connected between the pixel-electrode pad 1211 and the pixel-electrode pad 1311, so that the repairing micro light emitting element 15 replaces the failed or dropped micro light emitting element of the original sub-pixel unit $SP_1$ to emit light. If the original sub-pixel unit $SP_3$ of the pixel unit P1c is a defective pixel, a repairing circuit 163 is connected between the pixel-electrode pad 1231 and the pixel-electrode pad 1311, so that the repairing micro light emitting element 15 replaces the failed or dropped micro light emitting element of the original sub-pixel unit $SP_3$ to emit light.

Figure 7:
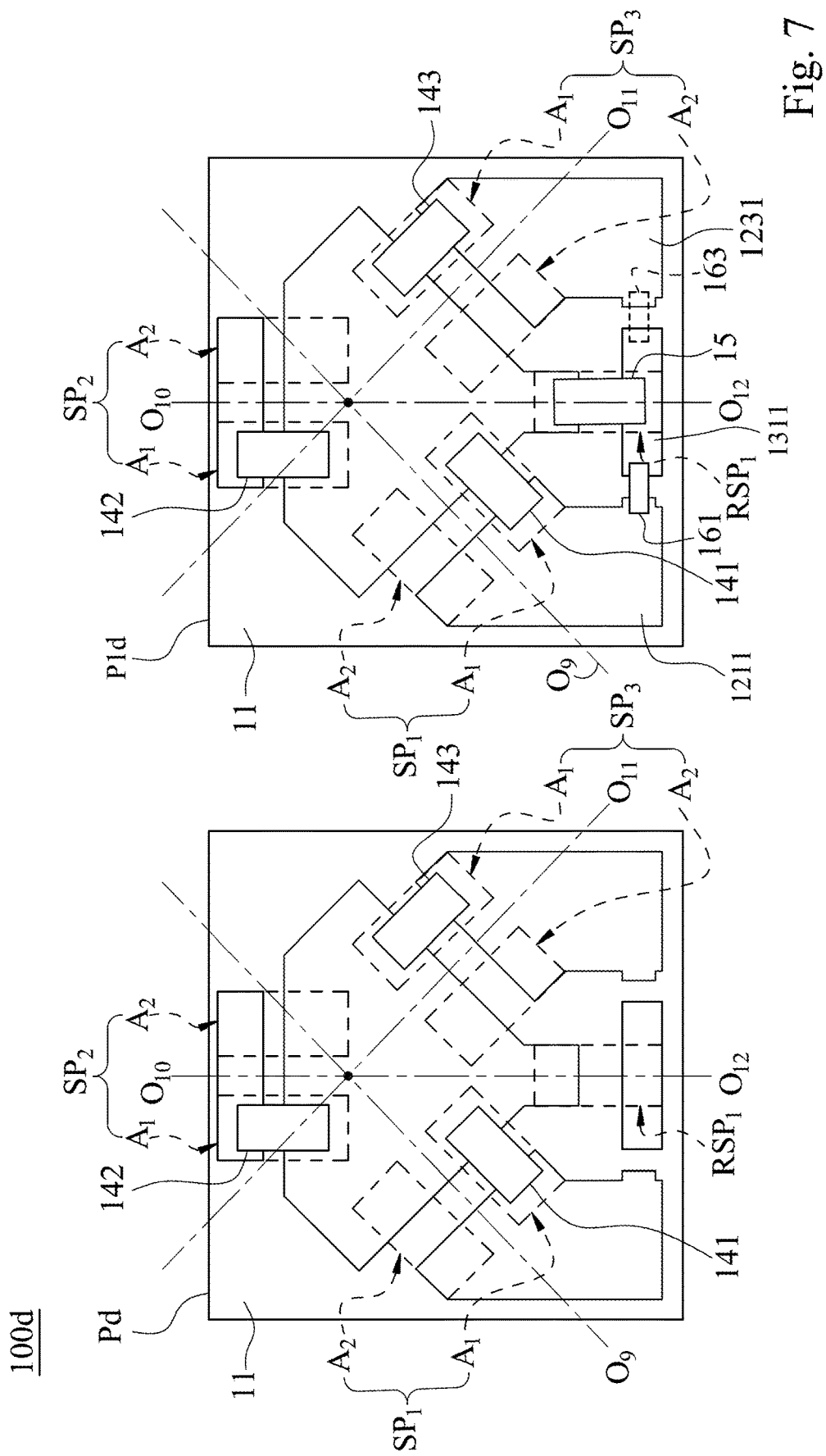
FIG. 7 shows a schematic view of two pixel units of a selectable-repairing micro light emitting diode display according to a fifth embodiment of the present disclosure.

FIG. 7 shows a schematic view of two pixel units Pd, P1d of a selectable-repairing micro light emitting diode display 100d according to a fifth embodiment of the present disclosure. In FIG. 7, the original sub-pixel units $SP_1$, $SP_2$, $SP_3$ of each of the pixel units Pd, P1d include a plurality of central axes $O_9$, $O_{10}$, $O_{11}$, respectively. The selectable-repairing sub-pixel unit $RSP_1$ includes a central axis $O_{12}$. The central axes $O_9$, $O_{10}$, $O_{11}$ of the original sub-pixel units $SP_1$, $SP_2$, $SP_3$ and the central axis $O_{12}$ of the selectable-repairing sub-pixel unit $RSP_1$ intersect each other. In detail, each of the pixel units Pd, P1d includes a polygon-shape common-electrode pad and a plurality of pixel-electrode pads surrounding the polygon-shape common-electrode pad.

In the fifth embodiment, the pixel unit Pd is a good pixel that has not failed and does not need an arrangement of a predestinated micro light emitting element and a repairing micro light emitting element. The original sub-pixel unit $SP_1$ of the pixel unit P1d is a defective pixel, and the pixel unit P1d includes a repairing micro light emitting element 15. The repairing micro light emitting element 15 is bonded to the pixel-electrode pad 1311 and the aforementioned common-electrode pad which is integrally formed. In addition, the pixel unit P1d further includes a repairing circuit 161, and the repairing circuit 161 is connected between the pixel-electrode pad 1211 and the pixel-electrode pad 1311, so that the repairing micro light emitting element 15 replaces the failed or dropped micro light emitting element of the original sub-pixel unit $SP_1$ to emit light. If the original sub-pixel unit $SP_3$ of the pixel unit P1d is a defective pixel, a repairing circuit 163 is connected between the pixel-electrode pad 1231 and the pixel-electrode pad 1311, so that the repairing micro light emitting element 15 replaces the failed or dropped micro light emitting element of the original sub-pixel unit $SP_3$ to emit light.

Therefore, the selectable-repairing micro light emitting diode displays 100b, 100c, 100d of the present disclosure have uniform color performance by using the arrangement of each of the original sub-pixel units $SP_1$, $SP_2$, $SP_3$ and each of the selectable-repairing sub-pixel units $RSP_1$, $RSP_2$.

Figure 8:
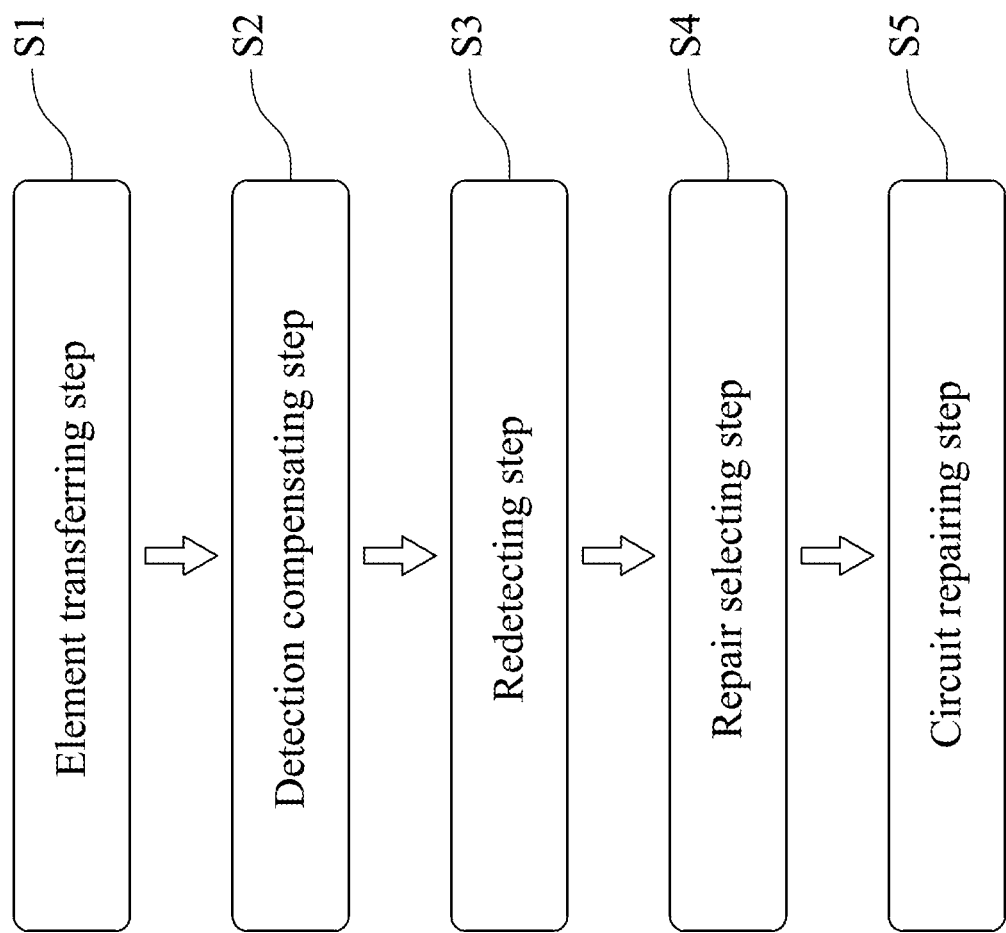
FIG. 8 shows a flow chart of a repairing method of the selectable-repairing micro light emitting diode display according to the first embodiment of the present disclosure.

Please refer to FIGS. 1 to 8. FIG. 8 shows a flow chart of a repairing method 200 of the selectable-repairing micro light emitting diode display 100 according to the first embodiment of the present disclosure. In FIG. 8, the repairing method 200 of the selectable-repairing micro light emitting diode display 100 includes performing an element transferring step S1, a detection compensating step S2, a redetecting step S3, a repair selecting step S4 and a circuit repairing step S5.

The element transferring step S1 is performed to provide the backplane 11. The plurality of pixel units P are disposed on the backplane 11. Each of the pixel units P includes the plurality of original sub-pixel units $SP_1$, $SP_2$, $SP_3$ and the two selectable-repairing sub-pixel units $RSP_1$, $RSP_2$. The original sub-pixel units $SP_1$, $SP_2$, $SP_3$ have different colors. In addition, the element transferring step S1 is performed to process Pick and Place through microelectromechanical array technology and mass transfer the plurality of micro light emitting elements 141, 142, 143 to the plurality of light emitting areas $A_1$ of the original sub-pixel units $SP_1$, $SP_2$, $SP_3$. The micro light emitting elements 141, 142, 143 are controlled to emit light through the corresponding transistor units 17, respectively.

The detection compensating step S2 is performed to detect the micro light emitting elements 141, 142, 143 in the light emitting areas $A_1$ and electrically bond the plurality of predestinated micro light emitting elements 141', 142', 143' to the plurality of compensation areas $A_2$ of the original sub-pixel units $SP_1$, $SP_2$, $SP_3$ for repairing defective original sub-pixel units.

The redetecting step S3 is performed to detect the predestinated micro light emitting elements 141', 142', 143' in the compensation areas $A_2$ to obtain a detecting result. If the detecting result shows that the micro light emitting element 141 and the predestinated micro light emitting element 141' in the original sub-pixel unit $SP_1$ are defective Micro LEDs, the repair selecting step S4 is successively performed. It means that the detecting result shows a mapping information of failed original sub-pixel units on the backplane, and the detecting result includes micro light emitting element missing and dark micro light emitting element.

The repair selecting step S4 is performed to dispose the repairing micro light emitting element 15 on the set of repairing pad 131 of the selectable-repairing sub-pixel unit $RSP_1$ according to the detecting result.

The circuit repairing step S5 is performed according to the detecting result to form the repairing circuit 161 between the set of original pad 121 of the original sub-pixel unit $SP_1$ and the set of repairing pad 131 of the selectable-repairing sub-pixel unit $RSP_1$, and to electrically connect the set of original pad 121 and the set of repairing pad 131. If the detecting result shows that the micro light emitting element 143 and the predestinated micro light emitting element 143' in the original sub-pixel unit $SP_3$ are defective Micro LEDs, the circuit repairing step S5 is performed according to the detecting result to form the repairing circuit 163 between the set of original pad 123 of the original sub-pixel unit $SP_3$ and the set of repairing pad 131 of the selectable-repairing sub-pixel unit $RSP_1$, and to electrically connect the set of original pad 123 and the set of repairing pad 131. Therefore, the repairing method 200 of the selectable-repairing micro light emitting diode display 100 of the present disclosure can freely select and repair the original sub-pixel unit $SP_1$ or the original sub-pixel unit $SP_1$ by deposing the repairing circuit 161 and the repairing circuit 163 on different positions, so that the space utilization of the pixel units P is increased, and the overall yield is improved.

In detail, in response to determining that the detecting result shows that the micro light emitting element 141 of the original sub-pixel unit $SP_1$ is a defective Micro LED, and judges that the original sub-pixel unit $SP_1$ is a defective sub-pixel, the micro light emitting element 141 that is failed can be repaired not only through the predestinated micro light emitting element 141' in the compensation area $A_2$ but also through the repairing micro light emitting element 151 deposed on the set of repairing pad 131. In addition, the repair selecting step S4 is performed to remove the corresponding predestinated micro light emitting element 141' from the compensation area $A_2$ of the original sub-pixel unit $SP_1$ according to the detecting result (that is, the original sub-pixel unit $SP_1$ is the defective sub-pixel).

Further, the circuit repairing step S5 is performed to connect the repairing circuit 161 between the pixel-electrode pad 1211 of the set of original pad 121 and the pixel-electrode pad 1311 of the set of repairing pad 131 according to the detecting result. Therefore, in response to determining that one of the original sub-pixel units $SP_1$, $SP_2$, $SP_3$ is the defective sub-pixel, the repairing method 200 of the selectable-repairing micro light emitting diode display 100 of the present disclosure can repair the micro light emitting elements 141, 142, 143 of the original sub-pixel units $SP_1$, $SP_2$, $SP_3$ not only through the predestinated micro light emitting elements 141', 142', 143' in the corresponding compensation areas $A_2$ but also through the selectable-repairing sub-pixel unit $RSP_1$ or the selectable-repairing sub-pixel unit $RSP_2$ so as to repair the defective sub-pixels.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A selectable-repairing micro light emitting diode display, comprising:
   a backplane comprising a plurality of transistor units;
   a plurality of pixel units disposed on the backplane, wherein each of the pixel units comprises a plurality of original sub-pixel units and at least one selectable-repairing sub-pixel unit, the original sub-pixel units have different colors, each of the original sub-pixel units comprises a set of original pad, the set of original pad is disposed on the backplane and correspondingly connected to one of the transistor units, the at least one selectable-repairing sub-pixel unit is arranged between two of the original sub-pixel units next to each other and having different colors and comprises a set of repairing pad, and the set of repairing pad is not connected to the transistor units;
   a plurality of micro light emitting elements electrically connected to the sets of original pad of the original sub-pixel units and controlled to emit light through the corresponding transistor units, respectively; and
   a repairing micro light emitting element and a repairing circuit located on one of the pixel units, wherein the repairing micro light emitting element is electrically bonded to the set of repairing pad of the at least one selectable-repairing sub-pixel unit of the one of the pixel units, and the repairing circuit is bonded to a surface of the set of repairing pad away from the backplane and selectively bonded to a surface of the set of original pad of one of said two of the original sub-pixel units next to each other away from the backplane,
   wherein the selectable-repairing sub-pixel unit has its light color determined by one of said two of the original sub-pixel units connected to the repairing circuit.

2. The selectable-repairing micro light emitting diode display of claim 1, wherein the original sub-pixel units are a first-color original sub-pixel unit, a second-color original sub-pixel unit and a third-color original sub-pixel unit, and the at least one selectable-repairing sub-pixel unit is arranged between the first-color original sub-pixel unit and the third-color original sub-pixel unit.

3. The selectable-repairing micro light emitting diode display of claim 2,
   wherein the repairing circuit is electrically connected to and disposed between the set of repairing pad and the set of original pad of the first-color original sub-pixel unit.

4. The selectable-repairing micro light emitting diode display of claim 3, wherein each of the sets of original pad comprises a pixel-electrode pad and a common-electrode pad, one of the micro light emitting elements is electrically bonded to the pixel-electrode pad and the common-electrode pad, the pixel-electrode pad is connected to the one of the transistor units, the set of repairing pad comprises a pixel-electrode pad and a common-electrode pad, the repairing micro light emitting element is electrically bonded to the pixel-electrode pad and the common-electrode pad of the set of repairing pad, and the repairing circuit is connected to the pixel-electrode pad of the first-color original sub-pixel unit and the pixel-electrode pad of the set of repairing pad.

5. The selectable-repairing micro light emitting diode display of claim 2,
   wherein the repairing circuit is electrically connected to and disposed between the set of repairing pad and the set of original pad of the third-color original sub-pixel unit.

6. The selectable-repairing micro light emitting diode display of claim 5, further comprising:
   a repairing micro light emitting element and a repairing circuit located on another of the pixel units, wherein the repairing micro light emitting element is electrically bonded to the set of repairing pad of the at least one selectable-repairing sub-pixel unit of the another of the pixel units, the repairing circuit is electrically connected to and disposed between the set of repairing pad and the set of original pad of the first-color original sub-pixel unit, each of the sets of original pad comprises a pixel-electrode pad and a common-electrode pad, one of the micro light emitting elements is electrically bonded to the pixel-electrode pad and the common-electrode pad, the set of repairing pad comprises a pixel-electrode pad and a common-electrode pad, the repairing micro light emitting element is electrically bonded to the pixel-electrode pad and the common-electrode pad of the set of repairing pad, and the repairing circuit is connected to the pixel-electrode pad of the first-color original sub-pixel unit and the pixel-electrode pad of the set of repairing pad.

7. The selectable-repairing micro light emitting diode display of claim 1, wherein each of the sets of original pad comprises two pixel-electrode pads and two common-electrode pads, and each of the original sub-pixel units comprises:
   a light emitting area having one of the pixel-electrode pads and one of the common-electrode pads, and configured to dispose one of the micro light emitting elements; and
   a compensation area having another of the pixel-electrode pads and another of the common-electrode pads, wherein the one of the pixel-electrode pads of the light emitting area and the another of the pixel-electrode pads of the compensation area are electrically connected to the one of the transistor units.

8. The selectable-repairing micro light emitting diode display of claim 1, wherein each of the pixel units comprises a common-electrode pad and a plurality of pixel-electrode pads surrounding the common-electrode pad, and each of the original sub-pixel units comprises:
   a light emitting area having one of the pixel-electrode pads and the common-electrode pad, and configured to dispose one of the micro light emitting elements; and
   a compensation area having another of the pixel-electrode pads and the common-electrode pad, wherein the one of the pixel-electrode pads in the light emitting area and the another of the pixel-electrode pads in the compensation area are electrically connected to the one of the transistor units.

9. The selectable-repairing micro light emitting diode display of claim 7, wherein the light emitting area of each of the original sub-pixel units comprises a central axis, the compensation area of each of the original sub-pixel units comprises a central axis, the at least one selectable-repairing sub-pixel unit comprises a central axis, and the central axis of the light emitting area of each of the original sub-pixel units, the central axis of the compensation area of each of the original sub-pixel units and the central axis of the at least one selectable-repairing sub-pixel unit intersect each other at a center of the backplane.

10. The selectable-repairing micro light emitting diode display of claim 7, wherein each of the original sub-pixel units comprises a central axis, the at least one selectable-repairing sub-pixel unit comprises a central axis, and the central axis of each of the original sub-pixel units and the central axis of the at least one selectable-repairing sub-pixel unit intersect each other.

\* \* \* \* \*